United States Patent
Gao et al.

(10) Patent No.: US 11,271,052 B2
(45) Date of Patent: Mar. 8, 2022

(54) DISPLAY SUBSTRATE COMPRISING LOW-TEMPERATURE POLYCRYSTALLINE OXIDE

(71) Applicant: WUHAN CHINA STAR OPTOELECTRONICS SEMICONDUCTOR DISPLAY TECHNOLOGY CO., LTD., Hubei (CN)

(72) Inventors: Hong Gao, Hubei (CN); Mugyeom Kim, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 72 days.

(21) Appl. No.: 16/761,532

(22) PCT Filed: Apr. 3, 2020

(86) PCT No.: PCT/CN2020/083252
§ 371 (c)(1),
(2) Date: May 5, 2020

(87) PCT Pub. No.: WO2021/184438
PCT Pub. Date: Sep. 23, 2021

(65) Prior Publication Data
US 2021/0296411 A1 Sep. 23, 2021

(30) Foreign Application Priority Data
Mar. 18, 2020 (CN) .......................... 202010190784.4

(51) Int. Cl.
*H01L 27/32* (2006.01)
*H01L 27/146* (2006.01)
(Continued)

(52) U.S. Cl.
CPC .... *H01L 27/3234* (2013.01); *H01L 27/14678* (2013.01); *H01L 27/3244* (2013.01);
(Continued)

(58) Field of Classification Search
CPC . H01L 27/14678; H01L 27/146–14893; H01L 27/3234; H01L 27/3244–3253; H01L 27/3251
See application file for complete search history.

(56) References Cited

U.S. PATENT DOCUMENTS

2021/0134896 A1* 5/2021 Guo .................... H01L 27/3218

OTHER PUBLICATIONS

CN 109801946A, published May 24, 2019 (Year: 2019).*

* cited by examiner

*Primary Examiner* — Suberr L Chi
(74) *Attorney, Agent, or Firm* — Mark M. Friedman

(57) ABSTRACT

The present disclosure provides a display substrate including a display area and a fingerprint recognition area. The display area includes a low-temperature polycrystalline oxide structure, an organic light-emitting layer, a cathode layer, and an anode layer that are sequentially stacked. The fingerprint recognition area includes an under-screen fingerprint recognition structure. The low-temperature polycrystalline oxide structure and the under-screen fingerprint recognition structure are disposed on a same layer. The under-screen fingerprint recognition structure includes the cathode layer and the organic light-emitting layer.

14 Claims, 2 Drawing Sheets

(51) Int. Cl.
*H01L 51/50* (2006.01)
*G06K 9/00* (2022.01)
*H01L 51/52* (2006.01)

(52) U.S. Cl.
CPC ........ *G06K 9/0004* (2013.01); *H01L 51/5012* (2013.01); *H01L 51/5218* (2013.01); *H01L 51/5225* (2013.01); *H01L 51/5234* (2013.01); *H01L 2251/5315* (2013.01)

DISPLAY SUBSTRATE COMPRISING LOW-TEMPERATURE POLYCRYSTALLINE OXIDE

FIELD OF INVENTION

The present disclosure relates to the technical field of display devices, and particularly to a display substrate with an under-screen fingerprint recognition function.

BACKGROUND

With development of full-screen technology, power-saving technology and fingerprint on display (FOD) technology have become increasingly popular with consumers. With rapid development of the field of display devices, low-temperature polycrystalline oxide (LTPO) display panels have appeared. A current low-temperature polycrystalline oxide display panel usually comprises a low-temperature polysilicon thin film transistor and an oxide thin-film transistor. The low-temperature polysilicon thin film transistor has no threshold voltage drift and is used as a driving transistor. The oxide thin film transistor has good switching performance and is used as a switching transistor. Furthermore, LTPO technology has been used in watches as power-saving technology for emerging active matrix organic light-emitting diodes (AMOLEDs). The fingerprint on display technology has been applied to mobile phone terminals.

SUMMARY OF DISCLOSURE

The present invention provides a display substrate combining LTPO technology and under-screen fingerprint recognition technology, which can realize an under-screen fingerprint recognition function and a screen power saving function.

The present invention provides the following technical solutions.

The present disclosure provides a display substrate comprising:

a display area comprising a low-temperature polycrystalline oxide structure, an organic light-emitting layer, a cathode layer, and an anode layer that are sequentially stacked; and a fingerprint recognition area comprising an under-screen fingerprint recognition structure, wherein the under-screen fingerprint recognition structure is disposed on a same layer as the low-temperature polycrystalline oxide structure and comprises a gate electrode and an oxide, but does not comprise the cathode layer and the organic light-emitting layer, and the oxide is a photosensitive element and is used as an inductive sensor of the under-screen fingerprint recognition structure in a gap of a pixel structure;

wherein light emitted from the display area is reflected to the under-screen fingerprint recognition structure in the fingerprint recognition area by a fingerprint.

In an embodiment, light emitted by the organic light emitting layer in the display area is reflected to the oxide of the under-screen fingerprint recognition structure.

In an embodiment, the anode layer totally reflects light.

In an embodiment, the cathode layer semi-reflects light.

The present disclosure further provides a display substrate comprising:

a display area comprising a low-temperature polycrystalline oxide structure, an organic light-emitting layer, a cathode layer, and an anode layer that are sequentially stacked; and a fingerprint recognition area comprising an under-screen fingerprint recognition structure, wherein the under-screen fingerprint recognition structure is disposed on a same layer as the low-temperature polycrystalline oxide structure and does not comprise the cathode layer and the organic light-emitting layer;

wherein, light emitted from the display area is reflected to the under-screen fingerprint recognition structure in the fingerprint recognition area by a fingerprint.

In an embodiment, the under-screen fingerprint recognition structure comprises a gate electrode and an oxide, and the oxide is a photosensitive element and is used as an inductive sensor of the under-screen fingerprint recognition structure.

In an embodiment, light emitted by the organic light emitting layer in the display area is reflected to the oxide of the under-screen fingerprint recognition structure.

In an embodiment, the anode layer totally reflects light.

In an embodiment, the cathode layer semi-reflects light.

In an embodiment, the inductive sensor of the under-screen fingerprint recognition structure is disposed in a gap of a pixel structure.

The present disclosure further provides a display substrate comprising:

a display area comprising a low-temperature polycrystalline oxide structure, an organic light-emitting layer, a cathode layer, and an anode layer that are sequentially stacked; and a fingerprint recognition area comprising an under-screen fingerprint recognition structure;

wherein the low-temperature polycrystalline oxide structure and the under-screen fingerprint recognition structure are disposed on a same layer and share the cathode layer and the organic light-emitting layer, and light emitted from the display area is reflected to the under-screen fingerprint recognition structure in the fingerprint recognition area by a fingerprint.

In an embodiment, the under-screen fingerprint recognition structure further comprises a gate electrode and an oxide, and the oxide is a photosensitive element and is used as an inductive sensor of the under-screen fingerprint recognition structure.

In an embodiment, the anode layer totally reflects light.

In an embodiment, the cathode layer semi-reflects light.

The present invention provides a display substrate combining LTPO technology and under-screen fingerprint recognition technology, in which light emitted by an organic light-emitting layer is reflected by a finger and then sensed by an inductive sensor in an under-screen fingerprint recognition structure to wake up a screen, thereby realizing an induction function of a built-in fingerprint on display. Furthermore, the organic light-emitting layer is not a functional layer in the under-screen fingerprint recognition structure. Therefore, the organic light-emitting layer can be removed from the under-screen fingerprint recognition structure to allow more light reflected by the finger to enter the inductive sensor, thereby greatly improving light-sensing ability. The display substrate manufactured using the LTPO technology can also save screen power.

BRIEF DESCRIPTION OF DRAWINGS

In order to more clearly illustrate technical solutions in embodiments of the present invention, a brief description of accompanying drawings used in description of the embodiments will be given below. Obviously, the accompanying drawings in the following description are merely some

DETAILED DESCRIPTION

Figure 1:
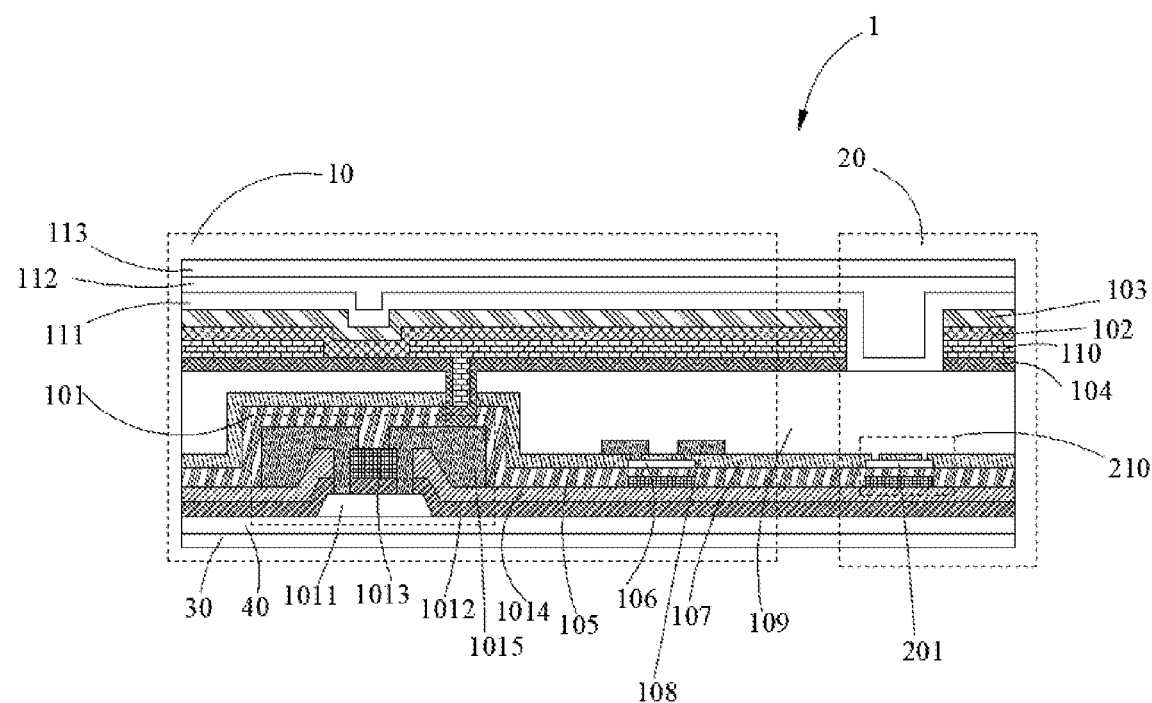
FIG. 1 is a schematic structural diagram of a display substrate according to an embodiment of the present invention.

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within the claimed scope of the present disclosure.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection, an electrical connection, or a mutual communication. A connection may be a direct connection or may be an indirect connection by using an intermediate medium. A connection may be an internal connection or an interaction between two elements. It may be appreciated by those of ordinary skill in the art that the specific meanings of the aforementioned terms in the present disclosure can be understood depending on specific situations.

In the present disclosure, unless otherwise specifically specified or limited, a structure in which a first feature is "on" or "under" a second feature may comprise an embodiment in which the first feature directly contacts the second feature, and may also comprise an embodiment in which the first feature and the second feature are not in direct contact with each other, but are contacted via an additional feature formed therebetween. Furthermore, a structure in which a first feature is "on", "above", or "on top of" a second feature may comprise an embodiment in which the first feature is right or obliquely "on", "above", or "on top of" the second feature, or just means that a sea-level elevation of the first feature is greater than a sea-level elevation of the second feature. A structure in which a first feature "under", "below", or "on bottom of" a second feature may include an embodiment in which the first feature is right "beneath," "below," or "on bottom of" the second feature, and may also comprises an embodiment in which the first feature is right or obliquely "under", "below", or "on bottom of" the second feature, or just means that a sea-level elevation of the first feature is less than a sea-level elevation of the second feature.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Please refer to FIG. 1, which is a schematic structural diagram of a display substrate 1 according to an embodiment of the present invention. An embodiment of the present invention provides a display substrate 1, comprising:
a display area 10 comprising a low-temperature polycrystalline oxide structure 101, an organic light-emitting layer 102, a cathode layer 103, and an anode layer 104 that are sequentially stacked; and
a fingerprint recognition area 20 comprising an under-screen fingerprint recognition structure 210, wherein the under-screen fingerprint recognition structure 210 is disposed on a same layer as the low-temperature polycrystalline oxide structure 101 and does not comprise the cathode layer 103 and the organic light-emitting layer 102;
wherein, light emitted from the display area 10 is reflected to the under-screen fingerprint recognition structure 210 in the fingerprint recognition area 20 by a fingerprint.

In the display area 10, a flexible substrate 30 is the bottommost layer. An insulating layer 40 is disposed on a side of the flexible substrate 30. The low-temperature polycrystalline oxide structure 101 is disposed on a side of the insulating layer 40 away from the flexible substrate 30. The low-temperature polycrystalline oxide structure 101 is configured as a TFT structure comprising a P-si layer 1011, a first gate insulating layer 1012, a gate electrode layer 1013, a first interlayer dielectric layer 1014, and a first source/drain electrode layer 1015. A second gate insulating layer 105 is disposed on the low-temperature polycrystalline oxide structure 101. A first oxide layer 106 is disposed on the second gate insulating layer 105. A second interlayer dielectric layer 107 is disposed on the first oxide layer 106 and covers the second gate insulating layer 105 and the first oxide layer 106. A second source/drain electrode layer 108 is disposed on the first oxide layer 106 and the second interlayer dielectric layer 107. A flat layer 109 is disposed on the second source/drain electrode layer 108 and covers the second source/drain electrode layer 108 and the second interlayer dielectric layer 107. An anode layer 104 is disposed on the flat layer 109. A pixel defining layer 110 is disposed on the anode layer 104. An organic light-emitting layer 102 is disposed on the pixel defining layer 110. A cathode layer 103 is disposed on the organic light-emitting layer 102. Other layers such as an insulating layer 111 and a polarizer layer 112 are disposed on the cathode layer 103 by a chemical vapor deposition method, an inkjet printing method, and the like. A glass cover 113 is bonded by an adhesive glue to complete packaging.

In the fingerprint recognition area 20, the flexible substrate 30, the insulating layer 40, the first gate insulating layer 1012, and the first interlayer dielectric layer 1014 are sequentially stacked. The gate electrode layer 1013 is disposed on the first interlayer dielectric layer 1014. The second gate insulating layer 105 is disposed on the gate electrode layer 1013 and completely covers the gate electrode layer 1013. A second oxide layer 201 is disposed on the second gate insulating layer 105. The second interlayer dielectric layer 107 is disposed on the second oxide layer 201. The flat layer 109 is disposed on the second interlayer dielectric layer 107. Other layers such as an insulating layer 111 and a polarizer layer 112 are disposed on the flat layer 109 by a chemical vapor deposition method, an inkjet printing method, and the like. A glass cover 113 is bonded by an adhesive glue to complete packaging. The flat layer 109, the second interlayer dielectric layer 107, the second oxide layer 201, the second gate insulating layer 105, and the gate electrode layer 1013 constitute the under-screen fingerprint recognition structure 210.

In this embodiment, as shown in FIG. 1, the under-screen fingerprint recognition structure 210 does not comprise the cathode layer 103 and the organic light-emitting layer 102. The second oxide layer 201 in the under-screen fingerprint recognition structure 210 is a photosensitive element. Therefore, the second oxide layer 201 is used as an inductive sensor of the under-screen fingerprint recognition structure 210. When light emitted by the organic light-emitting layer 102 is reflected to a sensing area of the second oxide layer 201 by a fingerprint on a screen, the screen can be woken up. Since the under-screen fingerprint recognition structure 210 does not comprise the cathode layer 103 and the organic light-emitting layer 102, more light reflected by the fingerprint will enter the sensing area of the second oxide layer 201, thereby improving light-sensing ability and making a fingerprint on display more sensitive.

As shown in FIG. 1, the low-temperature polycrystalline oxide structure 101 and the under-screen fingerprint recognition structure 210 are disposed on a same layer. The anode layer 104 has a characteristic of totally reflecting light, and the cathode layer 103 has a characteristic of semi-reflecting light.

In this embodiment, as shown in FIG. 1, the display substrate 1 comprises the low-temperature polycrystalline oxide structure 101 and the under-screen fingerprint recognition structure 210. The under-screen fingerprint recognition structure 210 does not comprise the organic light-emitting layer 102 and the cathode layer 103. The second oxide layer 201 in the sensing area of the under-screen fingerprint recognition structure 210 is a photosensitive element. After removing the organic light-emitting layer 102 and the cathode layer 103, more light reflected by the fingerprint enters the sensing area of the second oxide layer 201, thereby improving light-sensing ability of the under-screen fingerprint recognition structure 210.

Figure 2:
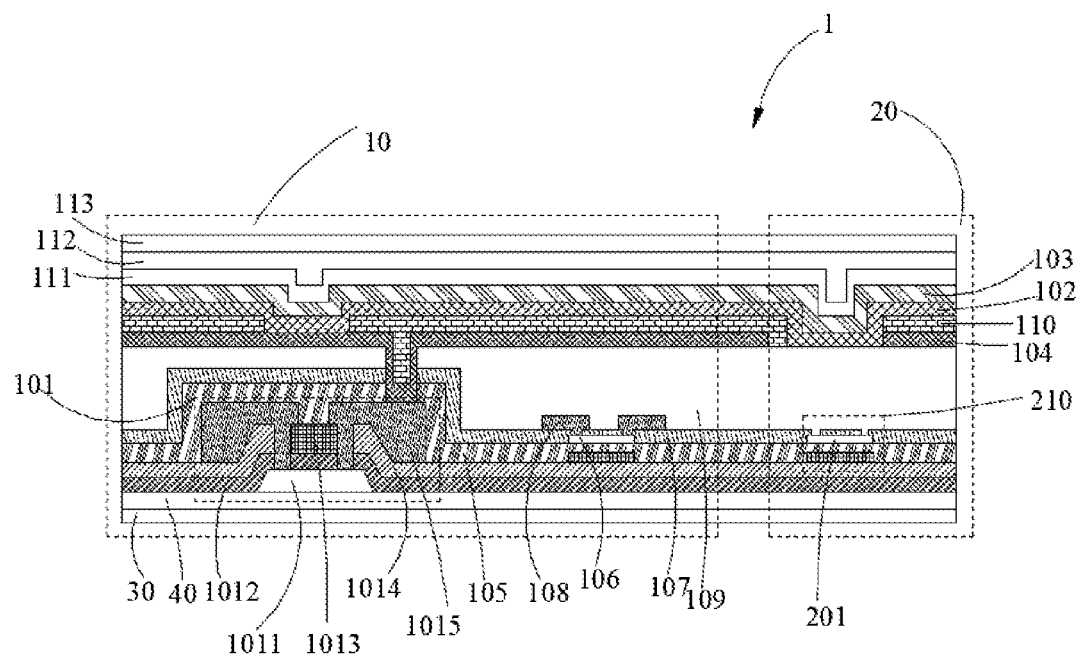
FIG. 2 is a schematic structural diagram of another display substrate according to an embodiment of the present invention.

Please refer to FIG. 2, which is a schematic structural diagram of another display substrate according to an embodiment of the present invention. An embodiment of the present invention provides a display substrate 1, comprising:

a display area 10 comprising a low-temperature polycrystalline oxide structure 101, an organic light-emitting layer 102, a cathode layer 103, and an anode layer 104 that are sequentially stacked; and a fingerprint recognition area 20 comprising an under-screen fingerprint recognition structure 210;

wherein the low-temperature polycrystalline oxide structure 101 and the under-screen fingerprint recognition structure 210 are disposed on a same layer and share the cathode layer 103 and the organic light-emitting layer 102, and light emitted from the display area 10 is reflected to the under-screen fingerprint recognition structure 210 in the fingerprint recognition area 20 by a fingerprint.

In the display area 10, a flexible substrate 30 is the bottommost layer. An insulating layer 40 is disposed on a side of the flexible substrate 30. The low-temperature polycrystalline oxide structure 101 is disposed on a side of the insulating layer 40 away from the flexible substrate 30. The low-temperature polycrystalline oxide structure 101 is configured as a TFT structure comprising a P-si layer 1011, a first gate insulating layer 1012, a gate electrode layer 1013, a first interlayer dielectric layer 1014, and a first source/drain electrode layer 1015. A second gate insulating layer 105 is disposed on the low-temperature polycrystalline oxide structure 101. A first oxide layer 106 is disposed on the second gate insulating layer 105. A second interlayer dielectric layer 107 is disposed on the first oxide layer 106 and covers the second gate insulating layer 105 and the first oxide layer 106. A second source/drain electrode layer 108 is disposed on the first oxide layer 106 and the second interlayer dielectric layer 107. A flat layer 109 is disposed on the second source/drain electrode layer 108 and covers the second source/drain electrode layer 108 and the second interlayer dielectric layer 107. An anode layer 104 is disposed on the flat layer 109. A pixel defining layer 110 is disposed on the anode layer 104. An organic light-emitting layer 102 is disposed on the pixel defining layer 110. A cathode layer 103 is disposed on the organic light-emitting layer 102. Other layers such as an insulating layer 111 and a polarizer layer 112 are disposed on the cathode layer 103 by a chemical vapor deposition method, an inkjet printing method, and the like. A glass cover 113 is bonded by an adhesive glue to complete packaging.

In the fingerprint recognition area 20, the flexible substrate 30, the insulating layer 40, the first gate insulating layer 1012, and the first interlayer dielectric layer 1014 are sequentially stacked. The gate electrode layer 1013 is disposed on the first interlayer dielectric layer 1014. The second gate insulating layer 105 is disposed on the gate electrode layer 1013 and completely covers the gate electrode layer 1013. A second oxide layer 201 is disposed on the second gate insulating layer 105. The second interlayer dielectric layer 107 is disposed on the second oxide layer 201. The flat layer 109 is disposed on the second interlayer dielectric layer 107. The organic light-emitting layer 102 is disposed on the flat layer 109. The cathode layer 103 is disposed on the organic light-emitting layer 102. Other layers such as an insulating layer 111 and a polarizer layer 112 are disposed on the cathode layer 103 by a chemical vapor deposition method, an inkjet printing method, and the like. A glass cover 113 is bonded by an adhesive glue to complete packaging. The flat layer 109, the second interlayer dielectric layer 107, the second oxide layer 201, the second gate insulating layer 105, and the gate electrode layer 1013 constitute the under-screen fingerprint recognition structure 210.

In this embodiment, as shown in FIG. 2, the second oxide layer 201 in the under-screen fingerprint recognition structure 210 is a photosensitive element. Therefore, the second oxide layer 201 is used as an inductive sensor of the under-screen fingerprint recognition structure 210. When light emitted by the organic light-emitting layer 102 is reflected to a sensing area of the second oxide layer 201 by a fingerprint on a screen, the screen can be woken up. As shown in FIG. 2, the low-temperature polycrystalline oxide structure 101 and the under-screen fingerprint recognition structure 210 are disposed on a same layer. The anode layer 104 has a characteristic of totally reflecting light, and the cathode layer 103 has a characteristic of semi-reflecting light.

Figure 3:
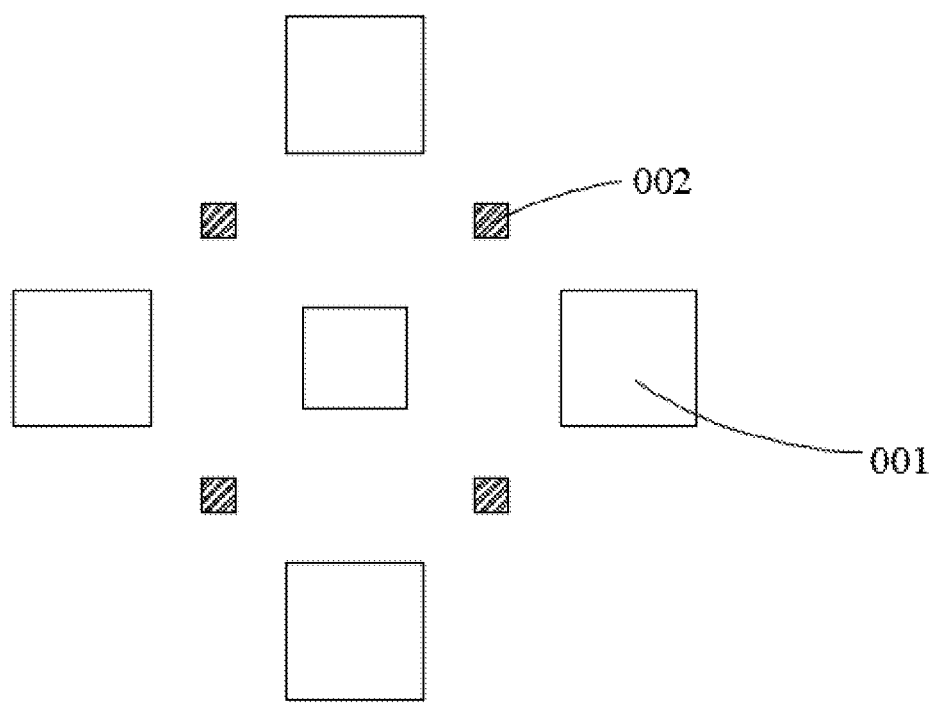
FIG. 3 is a schematic diagram showing relative positions of induction sensors of an under-screen fingerprint recognition structure.

Please refer to FIG. 3, which is a schematic diagram showing relative positions of induction sensors of an under-screen fingerprint recognition structure. As shown in FIG. 3, in a structure of a display substrate, inductive sensors 002 of an under-screen fingerprint recognition structure are disposed in gaps of RGB pixels 001, which can save space and improve response times of fingerprint recognition.

The present invention provides a display substrate combining LTPO technology and under-screen fingerprint recognition technology, in which light emitted by an organic light-emitting layer is reflected by a finger and then sensed by an inductive sensor in an under-screen fingerprint recognition structure to wake up a screen, thereby realizing an induction function of a built-in fingerprint on display. Furthermore, the organic light-emitting layer is not a functional layer in the under-screen fingerprint recognition structure. Therefore, the organic light-emitting layer can be removed from the under-screen fingerprint recognition structure to allow more light reflected by the finger to enter the inductive sensor, thereby greatly improving light-sensing ability. The display substrate manufactured using the LTPO technology can also save screen power.

The display substrates provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display substrate, comprising:
   a display area comprising a low-temperature polycrystalline oxide structure, an anode layer, an organic light-emitting layer, and a cathode layer that are sequentially stacked; and
   a fingerprint recognition area comprising an under-screen fingerprint recognition structure, wherein the under-screen fingerprint recognition structure is disposed on a same layer as the low-temperature polycrystalline oxide structure and comprises a gate electrode and an oxide, and the oxide is a photosensitive element and is used as an inductive sensor of the under-screen fingerprint recognition structure in a gap of a pixel structure;
   wherein parts of the anode layer, the organic light-emitting layer, and the cathode layer above the under-screen fingerprint recognition structure are hollowed, and light emitted from the display area is reflected to the under-screen fingerprint recognition structure in the fingerprint recognition area by a fingerprint.

2. The display substrate according to claim 1, wherein light emitted by the organic light emitting layer in the display area is reflected to the oxide of the under-screen fingerprint recognition structure.

3. The display substrate of claim 2, wherein the anode layer totally reflects light.

4. The display substrate of claim 2, wherein the cathode layer semi-reflects light.

5. A display substrate, comprising:
   a display area comprising a low-temperature polycrystalline oxide structure, an anode layer, an organic light-emitting layer, and a cathode layer, and an anode layer that are sequentially stacked; and
   a fingerprint recognition area comprising an under-screen fingerprint recognition structure, wherein the under-screen fingerprint recognition structure is disposed on a same layer as the low-temperature polycrystalline oxide structure;
   wherein parts of the anode layer, the organic light-emitting layer, and the cathode layer above the under-screen fingerprint recognition structure are hollowed, and light emitted from the display area is reflected to the under-screen fingerprint recognition structure in the fingerprint recognition area by a fingerprint.

6. The display substrate of claim 5, wherein the under-screen fingerprint recognition structure comprises a gate electrode and an oxide, and the oxide is a photosensitive element and is used as an inductive sensor of the under-screen fingerprint recognition structure.

7. The display substrate according to claim 6, wherein light emitted by the organic light emitting layer in the display area is reflected to the oxide of the under-screen fingerprint recognition structure.

8. The display substrate of claim 7, wherein the anode layer totally reflects light.

9. The display substrate of claim 7, wherein the cathode layer semi-reflects light.

10. The display substrate of claim 5, wherein the inductive sensor of the under-screen fingerprint recognition structure is disposed in a gap of a pixel structure.

11. A display substrate, comprising:
    a display area comprising a low-temperature polycrystalline oxide structure, an anode layer, an organic light-emitting layer, and a cathode layer that are sequentially stacked; and
    a fingerprint recognition area comprising an under-screen fingerprint recognition structure, the organic light-emitting layer, and the cathode layer, wherein the under-screen fingerprint recognition structure is disposed on a same layer as the low-temperature polycrystalline oxide structure;
    wherein a part of the anode layer above the under-screen fingerprint recognition structure is hollowed, and light emitted from the display area is reflected to the under-screen fingerprint recognition structure in the fingerprint recognition area by a fingerprint.

12. The display substrate of claim 11, wherein the under-screen fingerprint recognition structure further comprises a gate electrode and an oxide, and the oxide is a photosensitive element and is used as an inductive sensor of the under-screen fingerprint recognition structure.

13. The display substrate of claim 11, wherein the anode layer totally reflects light.

14. The display substrate of claim 11, wherein the cathode layer semi-reflects light.

* * * * *